US009502614B2

(12) United States Patent
Chen et al.

(10) Patent No.: US 9,502,614 B2
(45) Date of Patent: Nov. 22, 2016

(54) LIGHT EMITTING DIODE CHIP, LIGHT EMITTING DEVICE, AND WAFER-LEVEL STRUCTURE OF LIGHT EMITTING DIODE

(71) Applicant: Formosa Epitaxy Incorporation, Taoyuan County (TW)

(72) Inventors: Chun-Wei Chen, Taoyuan County (TW); Jen-Chih Li, Taoyuan County (TW); Shyi-Ming Pan, Taoyuan County (TW)

(73) Assignee: FORMOSA EPITAXY INCORPORATION, Taoyuan County (TW)

(*) Notice: Subject to any disclaimer, the term of this patent is extended or adjusted under 35 U.S.C. 154(b) by 0 days.

(21) Appl. No.: 14/492,077

(22) Filed: Sep. 22, 2014

(65) Prior Publication Data

US 2015/0357517 A1   Dec. 10, 2015

Related U.S. Application Data

(60) Provisional application No. 62/007,419, filed on Jun. 4, 2014.

(51) Int. Cl.
*H01L 29/06* (2006.01)
*H01L 21/00* (2006.01)
*H01L 33/20* (2010.01)
*H01L 33/60* (2010.01)

(52) U.S. Cl.
CPC ............... *H01L 33/20* (2013.01); *H01L 33/60* (2013.01)

(58) Field of Classification Search
USPC .............. 257/13, 79–103, 918, 40, 642–643, 257/759; 438/22–47, 69, 493, 503, 507, 438/956
See application file for complete search history.

(56) References Cited

U.S. PATENT DOCUMENTS

| | | | |
|---|---|---|---|
| 2004/0056260 A1* | 3/2004 | Slater, Jr. .............. | H01L 33/505 257/79 |
| 2009/0275157 A1* | 11/2009 | Winberg ................. | H01L 33/20 438/29 |
| 2011/0155997 A1* | 6/2011 | Lee ....................... | H01L 33/387 257/13 |

(Continued)

FOREIGN PATENT DOCUMENTS

| | | |
|---|---|---|
| TW | 521446 | 2/2003 |
| TW | I294699 | 3/2008 |

(Continued)

OTHER PUBLICATIONS

"Office Action of Taiwan Counterpart Application", issued on Mar. 3, 2016, p. 1-p. 4, in which the listed references were cited.

*Primary Examiner* — Selim Ahmed
*Assistant Examiner* — Moin Rahman
(74) *Attorney, Agent, or Firm* — Muncy, Geissler, Olds & Lowe, P.C.

(57) ABSTRACT

A light emitting device is provided with a growing base having specific geometry to prevent delamination between the encapsulant and the growing base, and thereby enhance structural reliability of the light emitting device. Furthermore, the light emitting efficiency as well as uniformity of light output of the light emitting device can be improved by forming the side surface of the growing base with at least a curved portion or slanted portion, and uneven structures can be formed on the curved portion or slanted portion to further improve the uniformity of light output. Furthermore, the light emitting diode chips can be fabricated by taking batch processing on the growing substrate, as provided in the wafer-level structure, with the advantages of saving cost, improving yield, etc.

9 Claims, 13 Drawing Sheets

(56) References Cited

U.S. PATENT DOCUMENTS

| | | | | |
|---|---|---|---|---|
| 2013/0260490 | A1* | 10/2013 | Shatalov | H01L 33/20 438/27 |
| 2014/0084317 | A1* | 3/2014 | Lee | H01L 33/58 257/98 |
| 2014/0124730 | A1* | 5/2014 | Choi | H01L 33/10 257/13 |
| 2014/0217436 | A1* | 8/2014 | Hussell | H01L 33/62 257/98 |

FOREIGN PATENT DOCUMENTS

| | | |
|---|---|---|
| TW | I346401 | 8/2011 |
| TW | 201143162 | 12/2011 |
| WO | 2013020513 | 2/2013 |

* cited by examiner

LIGHT EMITTING DIODE CHIP, LIGHT EMITTING DEVICE, AND WAFER-LEVEL STRUCTURE OF LIGHT EMITTING DIODE

CROSS-REFERENCE TO RELATED APPLICATION

This application claims the priority benefits of U.S. provisional application Ser. No. 62/007,419, filed on Jun. 4, 2014. The entirety of the above-mentioned patent application is hereby incorporated by reference herein and made a part of this specification.

BACKGROUND

1. Field of the Invention

The present application relates to a light emitting diode (LED) chip, a light emitting device, and a wafer-level structure of light emitting diode.

2. Description of Related Art

An LED chip is a semiconductor element constituted mainly by, for example, group III-V compound semiconductor materials. Since such semiconductor materials have a characteristic of converting electricity into light, when a current is applied to the semiconductor materials, electrons therein are combined with holes and excessive energy are released in form of light, thereby achieving an effect of luminosity.

Sapphire is often used as an epitaxial substrate in an LED chip. Since sapphire is a transparent material, an LED chip fabricated by using sapphire would scatter light to all directions without focusing the light and resulting in waste. Meanwhile, the scattered light is absorbed by each semiconductor layer inside the LED chip, and the light emitting efficiency of the LED chip is lowered.

Accordingly, it is desirable to provide improvements over present day LED chips.

SUMMARY OF THE INVENTION

The present application provides a light emitting device comprising a light emitting diode (LED) chip and an encapsulant. The LED chip comprises an LED structure layer having a first surface and a second surface opposite to the first surface, two electrodes disposed on the first surface, and a growing base. The growing base comprises a third surface facing the LED structure layer, a fourth surface opposite to the third surface, and a side surface connected between the third surface and the fourth surface, wherein the area of the fourth surface is larger than the area of the third surface. In addition, the encapsulant covers the fourth surface of the growing base and exposing the two electrodes.

As to the above, the light emitting device is provided with a growing base having specific geometry to prevent delamination between the encapsulant and the growing base, and thereby enhance structural reliability of the light emitting device.

The present application further provides a wafer-level structure of light emitting diode. The wafer-level structure comprises a growing substrate, an LED structure layer and a plurality of electrodes. The growing substrate being translucent has a top surface and a plurality of trenches on the top surface for defining the growing substrate into a plurality of substrate units. Each of the trenches has a width in cross section view gradually decreasing along a direction away from the top surface. The LED structure layer covers the top surface rather than the trenches. The plurality of electrodes is disposed on the LED structure layer.

As provided in the wafer-level structure, the light emitting diode chips can be fabricated by taking batch processing on the growing substrate with the advantages of saving cost, improving yield, etc. Each of the light emitting diode chips can be separated along the trenches from one another after dicing, and then covered by an encapsulant.

The present application further provides an LED chip, which comprises an LED structure layer having a first surface and a second surface opposite to the first surface, two electrodes disposed on the first surface, and a growing base. The growing base comprises a third surface facing the LED structure layer, a fourth surface opposite to the third surface, and a side surface connected between the third surface and the fourth surface. The area of the fourth surface is larger than the area of the third surface, and at least a portion of the side surface of the growing base is curved.

The aforementioned LED chip has at least a portion of the side surface being curved, and is applicable to be packaged by forming an encapsulant thereon. An encapsulant can be tightly fixed to the growing base due to the specific geometry of the growing base, which effectively prevents delamination between the encapsulant and the growing base. Furthermore, the light emitting efficiency as well as uniformity of light output of the LED chip can be improved by forming the side surface of the growing base with at least a curved portion.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF THE EMBODIMENTS

Reference will now be made in detail to the present preferred embodiments of the application, examples of which are illustrated in the accompanying drawings. Wherever possible, the same reference numbers are used in the drawings and the description to refer to the same or like parts.

Figure 1:
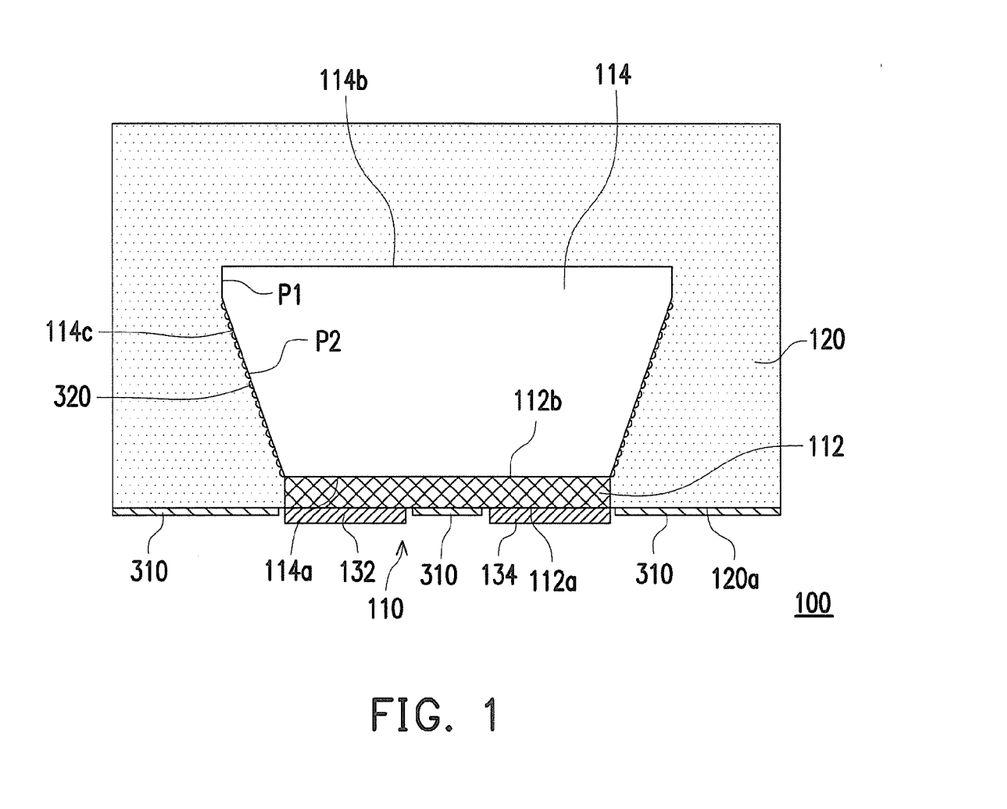
FIG. 1 illustrates a light emitting device according to an embodiment of the present application.

FIG. 1 illustrates a light emitting device 100 according to an embodiment of the present application. The light emitting device 100 can be formed by packaging an LED chip 110 with an encapsulant 120. The encapsulant 120 may comprise phosphors. The LED chip 110 comprises an LED structure layer 112 having a first surface 112a and a second surface 112b opposite to the first surface 112a, which can be formed on a growing base 114.

In the present embodiment, the growing base 114 is not removed after performing the manufacturing of the LED structure layer. The growing base 114 may be a sapphire substrate or other applicable substrate. The LED structure layer 112 is essentially formed from gallium nitride based compound semiconductor, like GaN, AlGaN, InGaN or etc. Since the growing base 114 is translucent, a portion of light emitted by the LED structure layer 112 can pass through the growing base 114, and then be outputted from the LED chip 110.

The growing base 114 comprises a third surface 114a facing the LED structure layer 112, a fourth surface 114b opposite to the third surface 114a, and a side surface 114c connected between the third surface 114a and the fourth surface 114b. Two electrodes 132 and 134 are provided on the first surface 112a of the LED structure layer 112, wherein one of the electrodes 132 and 134 is anode of the LED chip 110 and the other one is cathode of the LED chip 110.

In the present embodiment, the encapsulant 120 covers the fourth surface 114b and the side surface 114c of the growing base 114 and the LED structure layer 112, wherein the first surface 112a of the LED structure layer 112 and the two electrodes 132 and 134 are exposed. The encapsulant 120 has a fifth surface 120a which is near to and substantially parallel with the first surface 112a of the LED structure layer 112. Preferably, the fifth surface 120a of the encapsulant 120 is substantially coplanar with the first surface 112a. And, the end surface of the two electrodes 132 and 134 may be substantially coplanar with each other. In other words, the bottom of the light emitting device 100 is almost flat, which facilitates bonding the light emitting device 100 to an external circuitry, such as an interposer substrate, a printed circuit board (PCB), etc.

Furthermore, the growing base 114 of the present embodiment is formed in a specific geometry that the area of the fourth surface 114b is larger than the area of the third surface 114a. Thereby, after the LED chip 110 is packaged without any lead frame by directly forming the encapsulant 120 thereon, the growing base 114 having a larger upper portion can be tightly wedged in the encapsulant 120, to prevent delamination between the encapsulant 120 and the growing base 114. Accordingly, the structural reliability of the light emitting device 100 can be enhanced.

Figure 2:
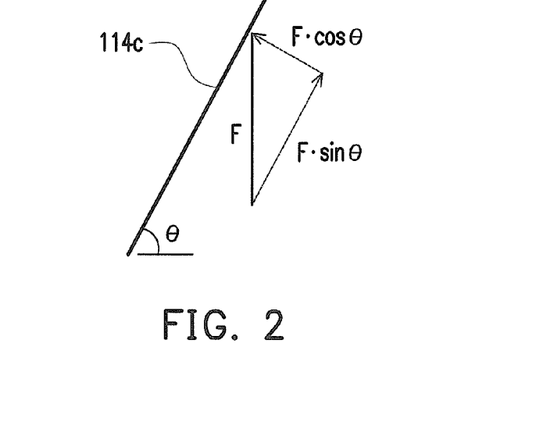
FIG. 2 is a force diagram showing components of force acting upon the side surface of the growing base of FIG. 1.

More specifically, as shown in FIG. 1, a portion of the side surface 114c of the growing base 114 is slanted. FIG. 2 is a force diagram showing components of force acting upon the side surface 114c of the growing base 114 slanted with an angle of inclination θ. In another aspect, when an external force F perpendicular to the third surface 114b is applied to the growing base 114, the external force F can be resolved into a vertical component F·cos θ and a horizontal component F·sin θ. It can be seen that since the side surface 114c of the growing base 114 is slanted, the area of the contact surface (i.e. the side surface 114c) between the growing base 114 and the encapsulant 120 is increased, so as to enhance the bonding effect between the growing base 114 and the encapsulant 120. Furthermore, the vertical component F·cos θ is generated as the side surface is slanted, and the vertical component F·cos θ contributes to the friction force between the growing base 114 and the encapsulant 120, such that the delamination between the encapsulant 120 and the growing base 114 can be effectively eliminated, and the structural reliability of the light emitting device 100 can be enhanced.

In the present embodiment as shown in FIG. 1, only a portion of the side surface 114c of the growing base 114 is slanted. More specifically, a first portion P1 of the side surface 114c adjacent to the third surface 114a is slanted, and a second portion P2 of the side surface 114c connected between the first portion P1 and the fourth surface 114b is flat and substantially perpendicular to the fourth surface 114b. However, the proportion of the slanted portion of the side surface 114c is limited. In further another embodiment of the present application, the entire side surface 114c may be slanted.

Furthermore, the profile of the side surface 114c of the growing base 114 is not limited to the slanted surface as shown in FIG. 1, and can be other applicable profiles, which depends on design or other practical requirements.

Figure 3:
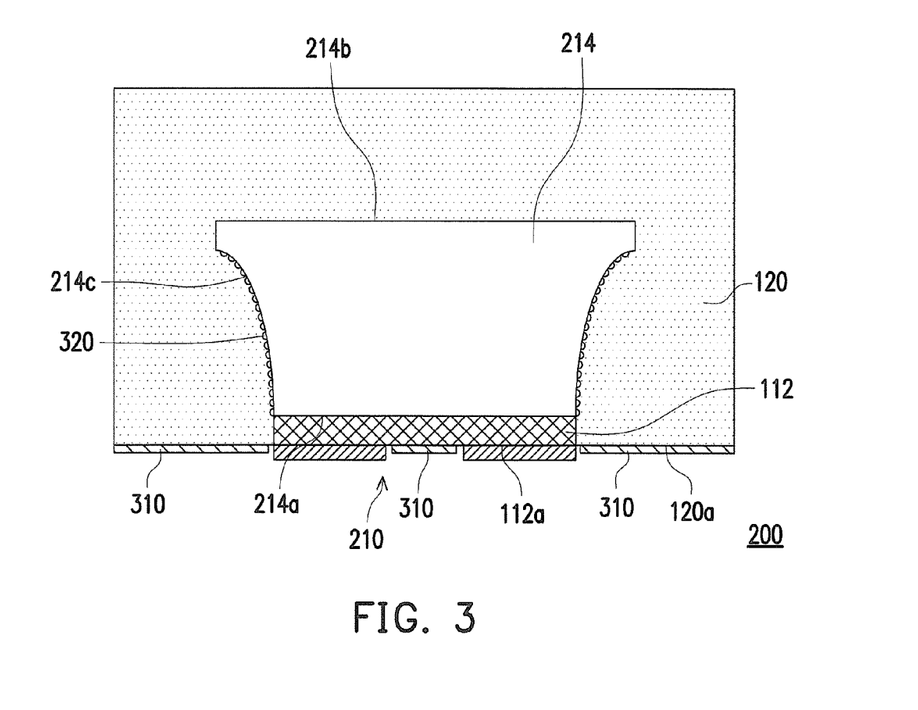
FIG. 3 illustrates a light emitting device according to another embodiment of the present application.

FIG. 3 illustrates a light emitting device 200 according to another embodiment of the present application. The same reference numbers of the previous embodiment are used in the present embodiment, to indicate similar or identical components. The LED chip 210 of the light emitting device 200 is similar to the LED chip 110 as shown in FIG. 1, except that: a portion of the side surface 214c of the growing base 214 is curved. Other features similar or identical to those mentioned above are not repeated hereinafter.

In comparing with the slanted portion of the side surface 114c as shown in FIG. 1, the curved portion of the side surface 214c formed on the growing base 214 provides much higher structural reliability to the light emitting device 200. More specifically, the curved portion of the side surface 214c generates larger vertical component when an external force perpendicular to the third surface 214b is applied to the growing base 214. In addition, the curved portion of the side surface 214c further increases the area of the contact surface between the growing base 214 and the encapsulant 220, such that the bonding effect between the growing base 214 and the encapsulant 220 can be further enhanced.

In the aforementioned two embodiments, the light emitting device 100 (or 200) may further include a reflective layer 310. The reflective layer 310 is formed on the bottom of the light emitting device 100 or 200 and covers at least a part of the fifth surface 120a of the encapsulant 120 for reflecting another portion of the light emitted by the LED structure layer 112. It is noted that the reflective layer 310 may further covers a portion of the first surface 112a of the LED structure layer 112. The reflective layer 310 may be formed from metal, like aluminium, silver or gold, or dielectric material. Gaps may exist between the reflective layer 310 and the two electrodes 132 and 134 to insulate the reflective layer 310. Therefore, the light emitted from the LED structure layer 112 toward the fifth surface 120a of the encapsulant 120 and the first surface 112a of the LED structure layer 112 can be reflected by the reflective layer 310, for further improving the light emitting efficiency of the light emitting device 100 or 200.

Moreover, for further improving the light emitting efficiency as well as uniformity of light output of the light emitting device, the growing base 114 (or 214) may be provided with uneven structures 320, such as bumps, holes, microstructures, etc., on the slanted or curved portion of the side surface 114c or 214c.

Figure 4A:
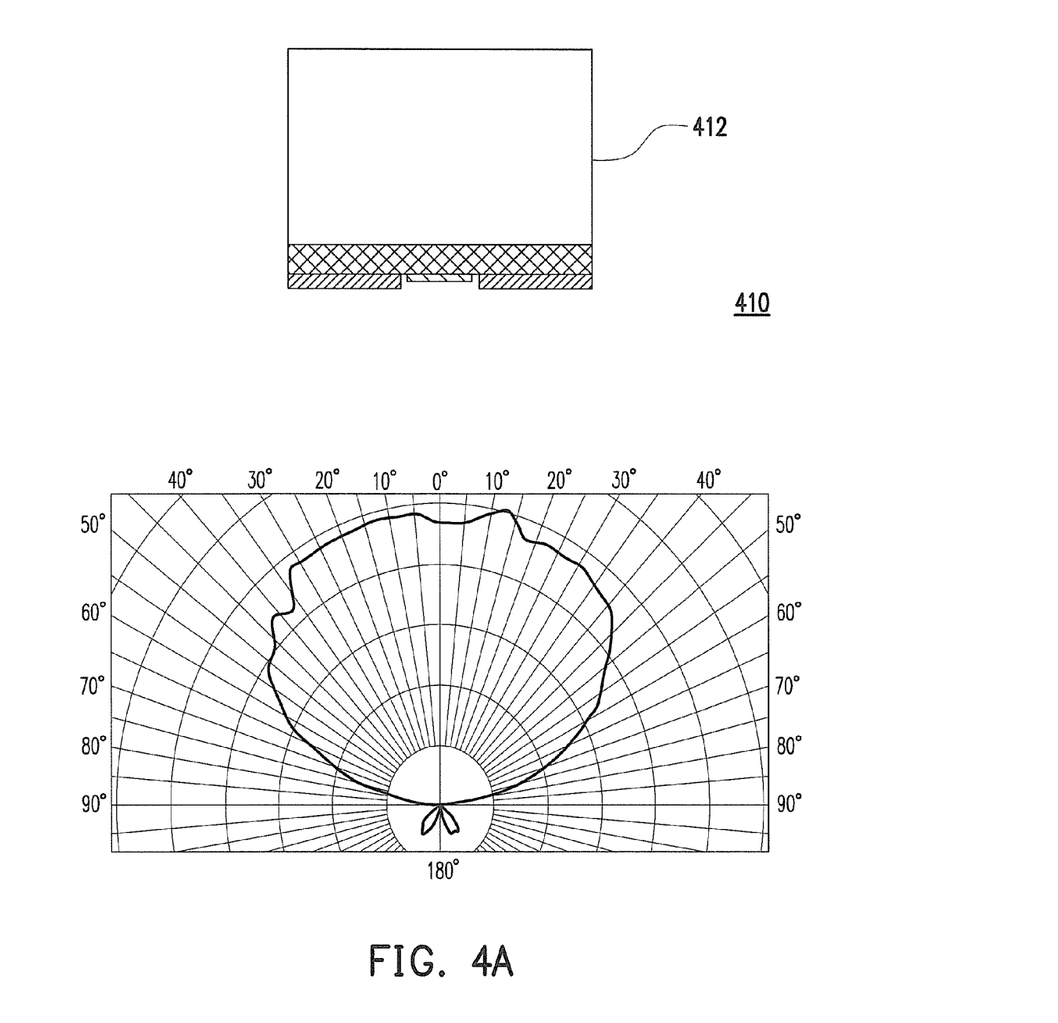
FIG. 4A through FIG. 4D respectively show light distribution of different types of light emitting devices according to the present application.
Figure 4B:
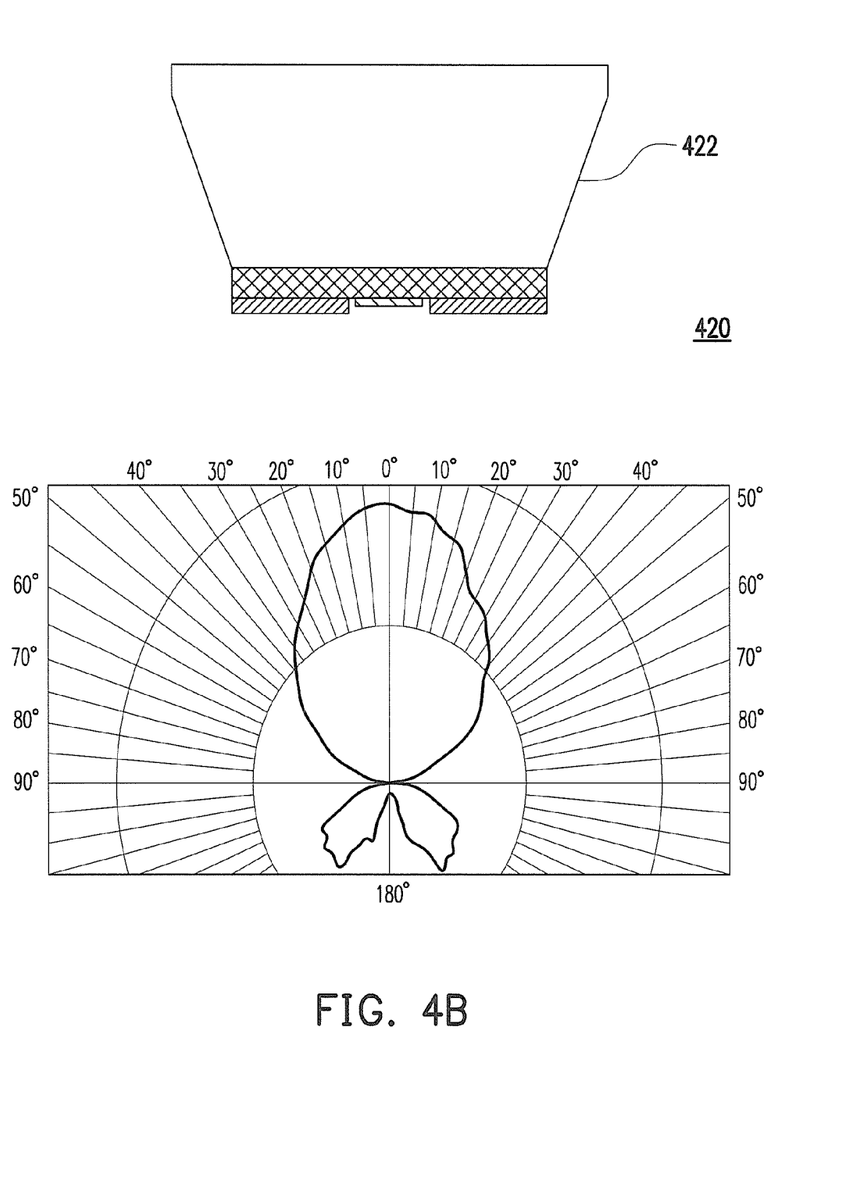
Figure 4C:
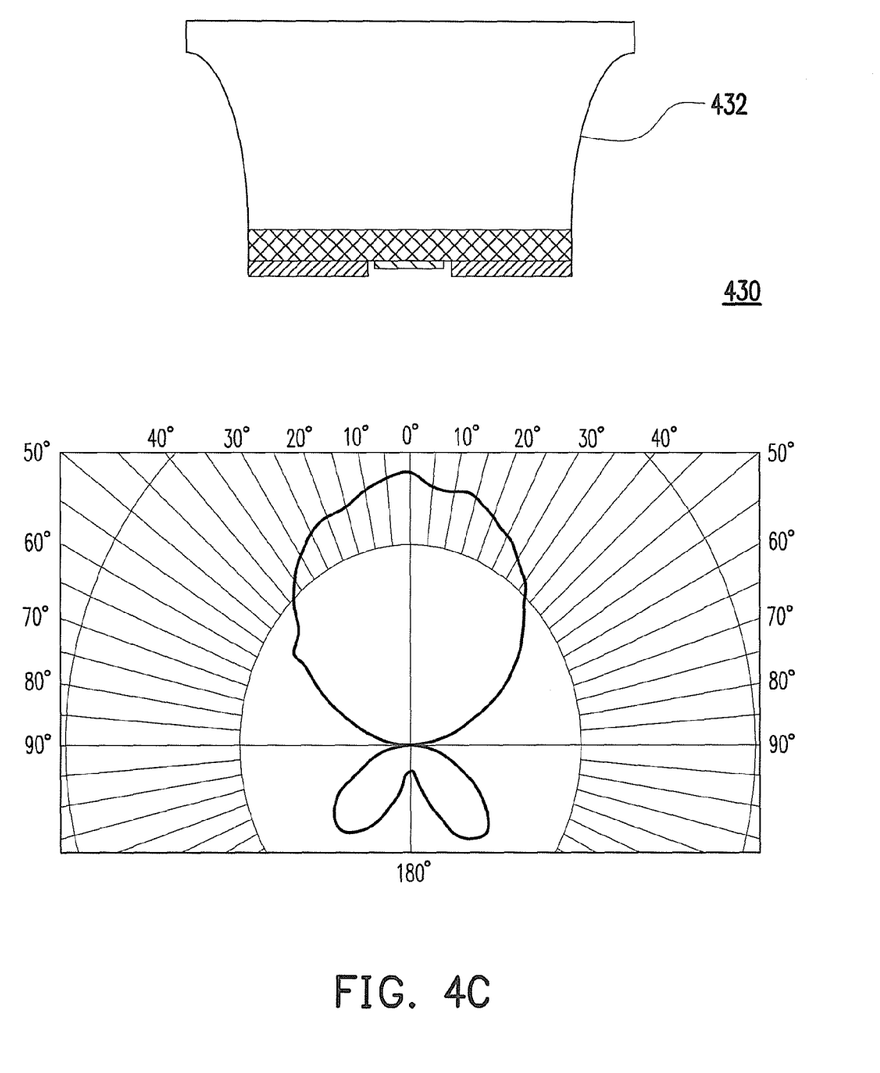
Figure 4D:
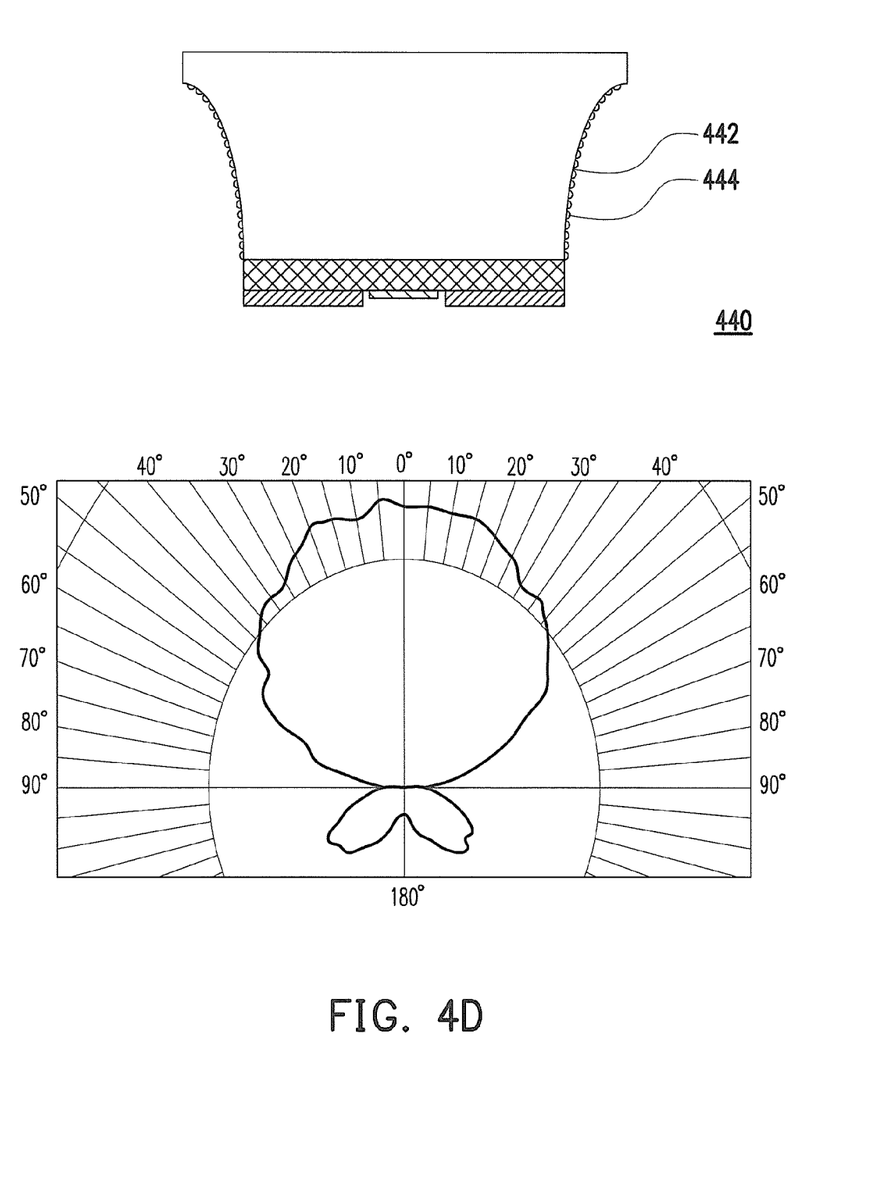

FIG. 4A through FIG. 4D respectively show the light distributions of different types of LED chips according to the present application. Each of FIG. 4A through FIG. 4D shows a structural diagram of the different types of LED chips and the light distribution thereof. FIG. 4A shows an LED chip 410A of type 1 having a vertical side surface 412. FIG. 4B shows an LED chip 410B of type 2 having a slanted side surface 422. FIG. 4C shows an LED chip 410C of type 3 having a curved side surface 432. FIG. 4D shows an LED chip 410D of type 4 having a curved side surface 442, wherein uneven structures 444, such as bumps, holes, microstructures, etc., are formed on the curved side surface 442. The following Table 1 is the experiment result to show the difference between these LED chips.

TABLE 1

|  | Type 1 | Type 2 | Type 3 | Type 4 |
|---|---|---|---|---|
| Luminous flux of LED chip (lm) | 100 | 100 | 100 | 100 |
| Luminous flux in upward direction (lm) | 39.83 | 43.28 | 42.14 | 47.48 |
| Luminous flux in downward direction (lm) | 3.42 | 26.68 | 25.31 | 22.99 |
| Total luminous flux (lm) | 43.25 | 69.96 | 67.45 | 70.47 |
| Total light efficiency (%) | 43 | 70 | 67 | 70 |
| Light loss (%) | 57 | 30 | 33 | 30 |
| $2\theta_{1/2}(°)$ | 144 | 102 | 116 | 134 |

According to the above Table 1, it can be seen that the total light efficiency of LED chips having slanted or curved side surfaces (type 2 to type 4) is dramatically increased as well as the light loss thereof is decreased. Furthermore, as compared with the LED chip 410B of type 2 and the LED chip 410C of type 3, the LED chip 410D of type 4 is provided with the uneven structures 444 on the side surface 442, and thereby obtains larger half-intensity-angle $2\theta_{1/2}$ of full width of half maximum (FWHM), which means the LED chip 410D of type 4 providing broader and more uniform light output than that of type 2 or type 3 does.

Figure 5A:
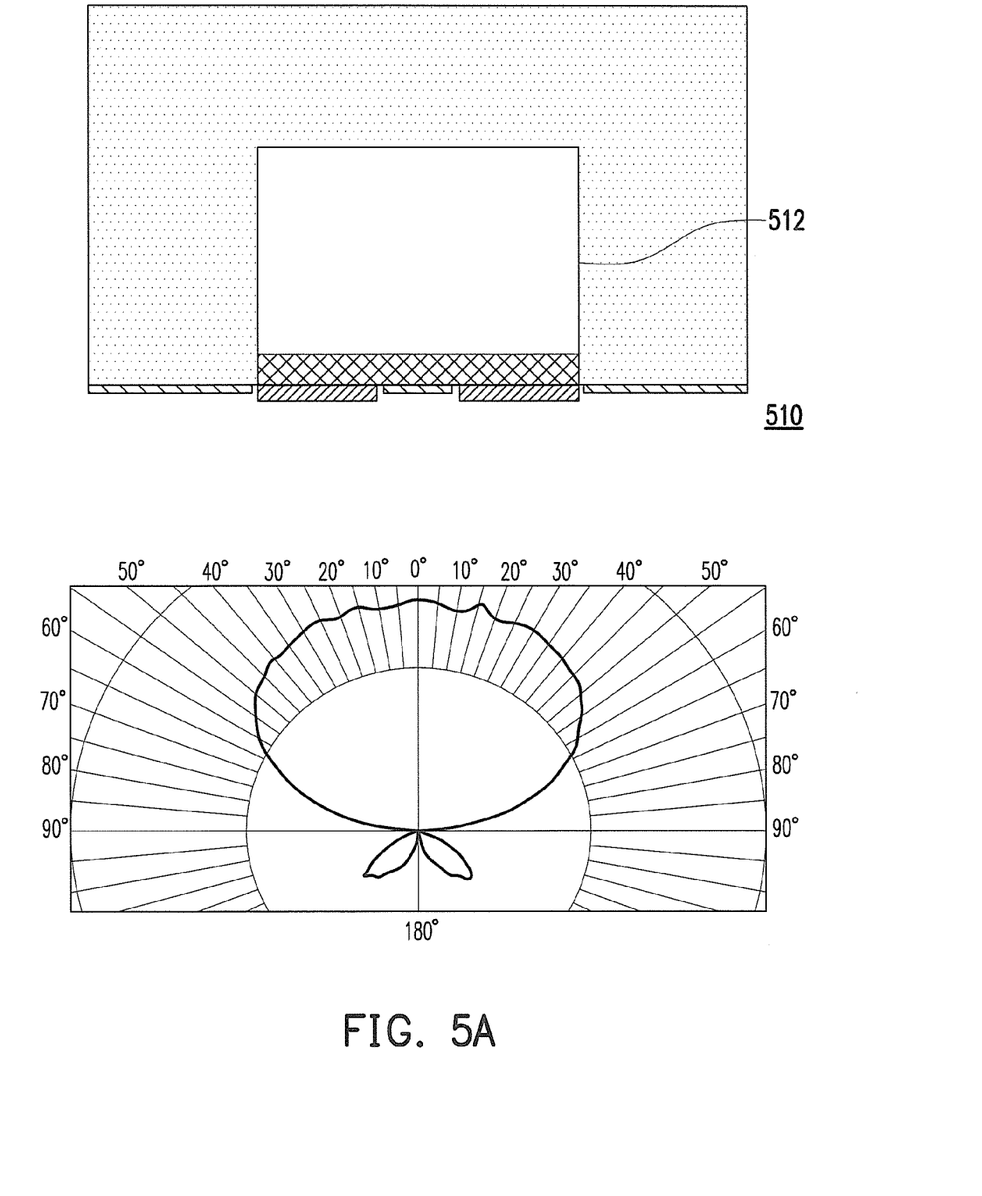
FIG. 5A through FIG. 5D respectively show light distribution of further different types of light emitting devices according to the present application.
Figure 5B:
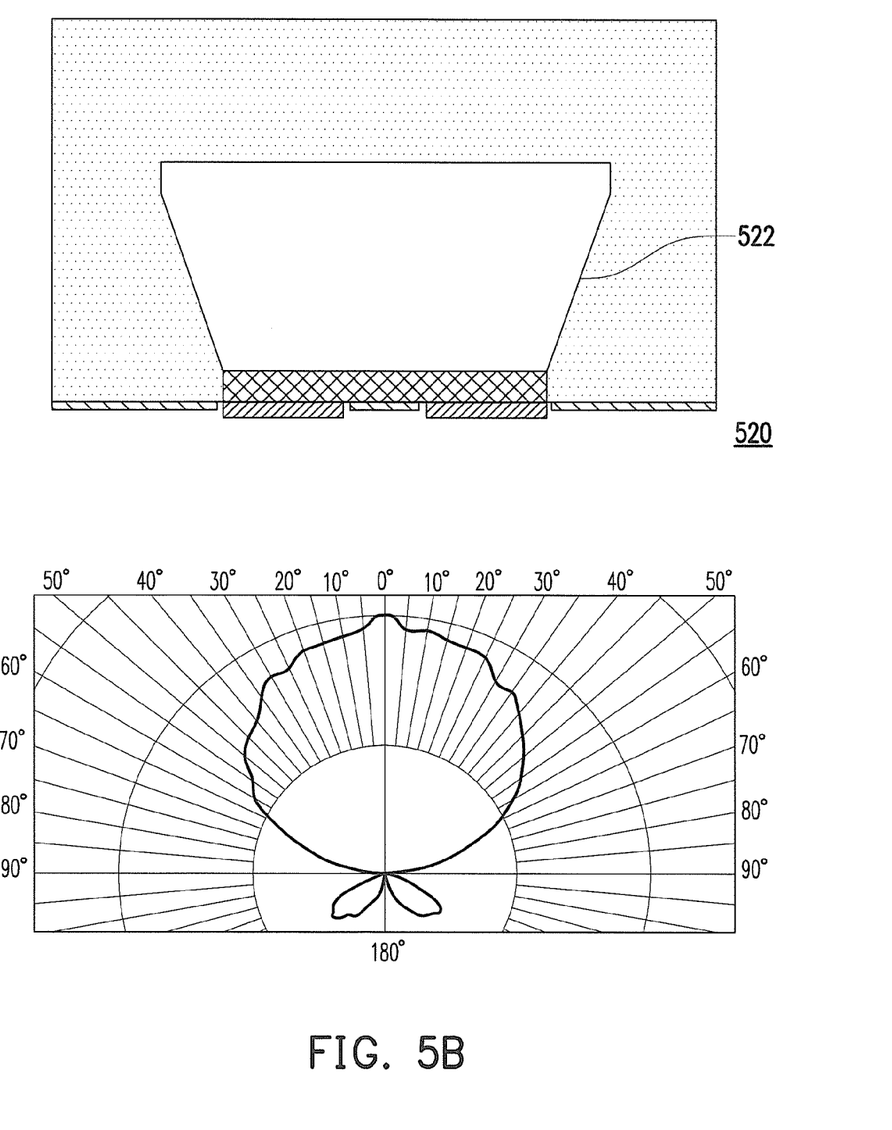
Figure 5C:
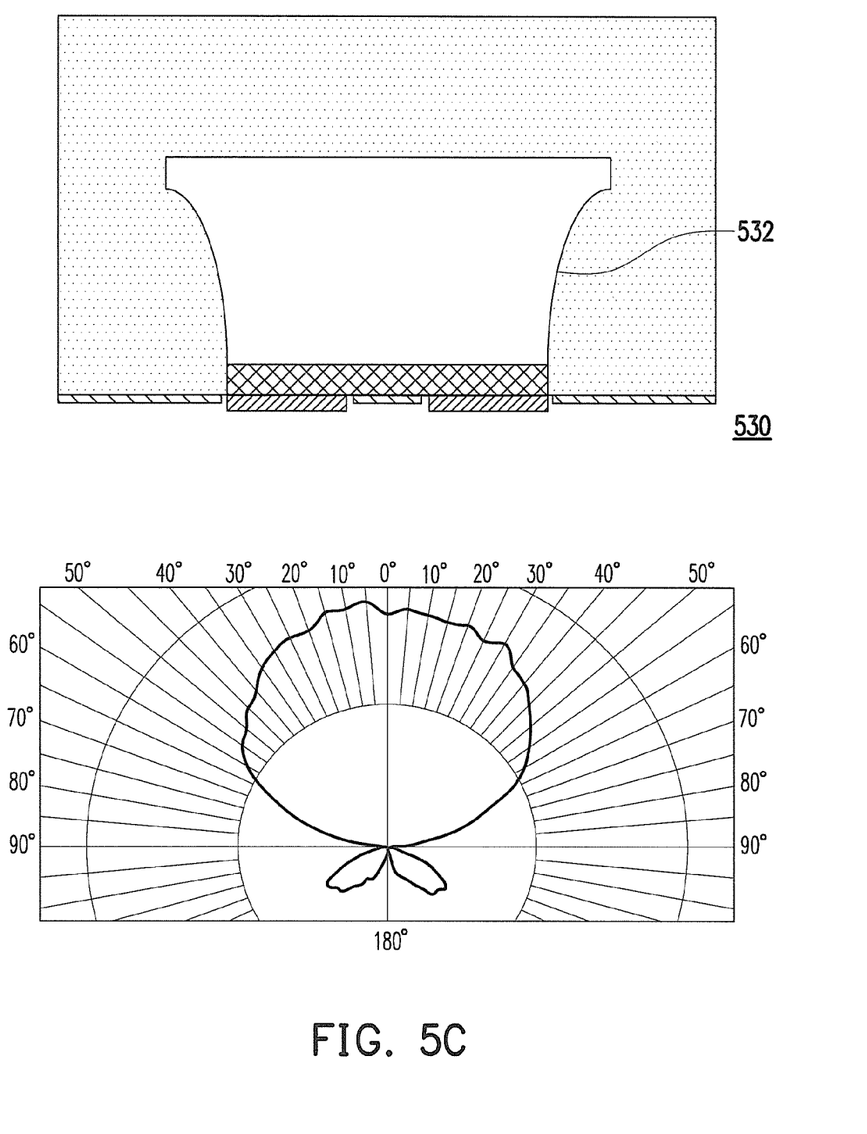
Figure 5D:
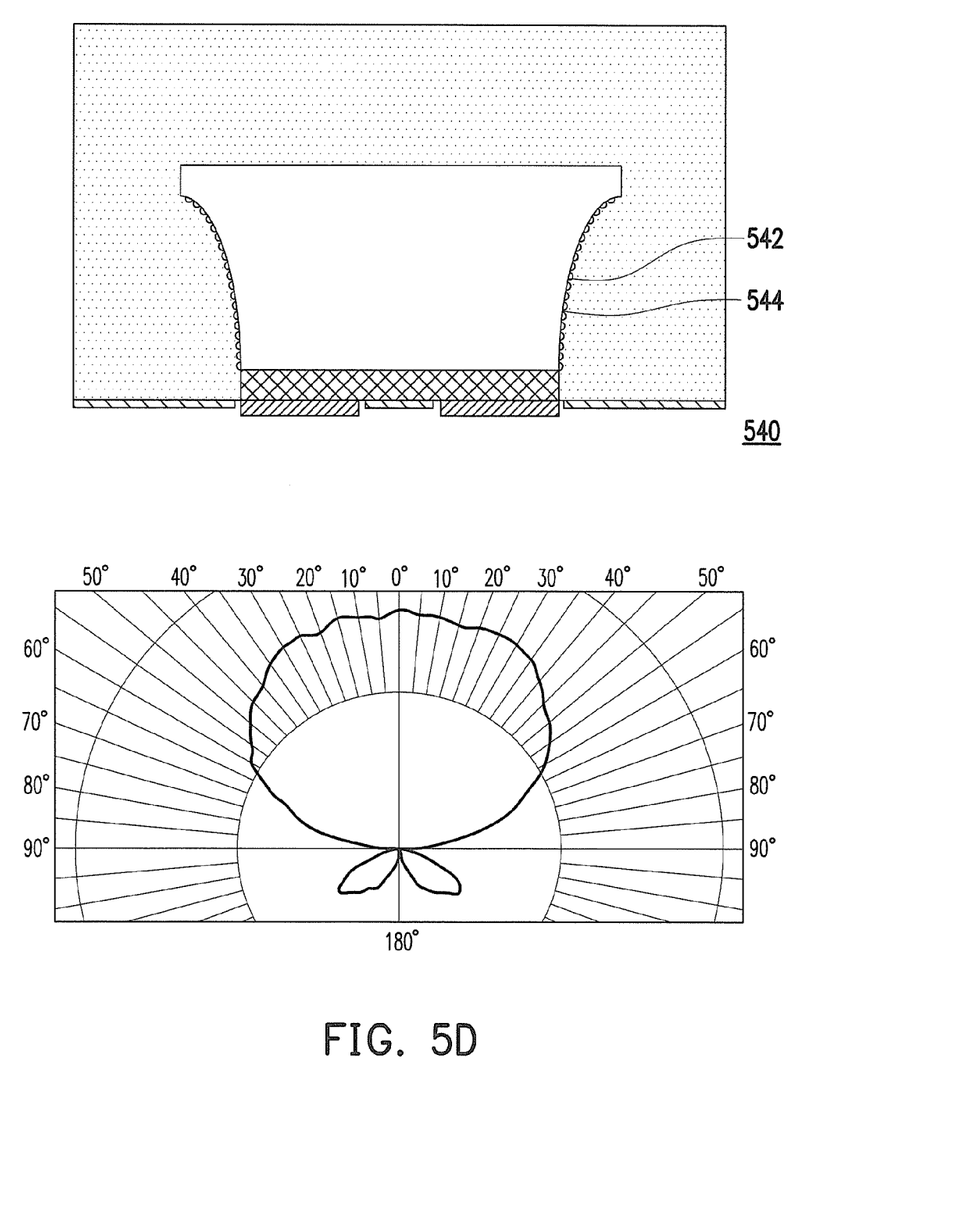

FIG. 5A through FIG. 5D respectively show light distribution of further different types of light emitting devices according to the present application. Each of FIG. 5A through FIG. 5D shows a structural diagram of the different types of light emitting devices and the light distribution thereof. FIG. 5A shows a light emitting device 500A of type 5 being covered by an encapsulant 516 and having a vertical side surface 512. FIG. 5B shows a light emitting device 500B of type 6 being covered by an encapsulant 526 and having a slanted side surface 522. FIG. 5C shows a light emitting device 500C of type 7 being covered by an encapsulant 536 and having a curved side surface 532. FIG. 5D shows a light emitting device 500D of type 8 being covered by an encapsulant 546 and having a curved side surface 542, wherein uneven structures 544, such as bumps, holes, microstructures, etc., are formed on the curved side surface 542. The following Table 2 is the experiment result to show the difference between these light emitting devices.

TABLE 2

|  | Type 5 | Type 6 | Type 7 | Type 8 |
|---|---|---|---|---|
| Luminous flux of LED chip (lm) | 100 | 100 | 100 | 100 |
| Luminous flux in upward direction (lm) | 61.4 | 61.88 | 60.23 | 62.22 |
| Luminous flux in downward direction (lm) | 16.75 | 20.56 | 20.83 | 21.52 |
| Total luminous flux (lm) | 78.15 | 82.4 | 81.06 | 83.74 |
| Total light efficiency (%) | 78 | 82 | 81 | 84 |
| Light loss (%) | 22 | 18 | 19 | 16 |
| $2\theta_{1/2}(°)$ | 152 | 124 | 135 | 138 |

According to the above Table 2, it can be seen that the total light efficiency of LED chips having slanted or curved side surfaces (type 6 to type 8) is dramatically increased as well as the light loss thereof is decreased. Furthermore, as compared with the light emitting device 500B of type 6 and the light emitting device 500C of type 7, the light emitting device 500D of type 8 is provided with the uneven structures 544 on the side surface 542, and thereby obtains larger half-intensity-angle $2\theta_{1/2}$ of full width of half maximum (FWHM), which means the light emitting device 500D of type 8 providing broader and more uniform light output than that of type 6 or type 7 does.

Figure 6A:
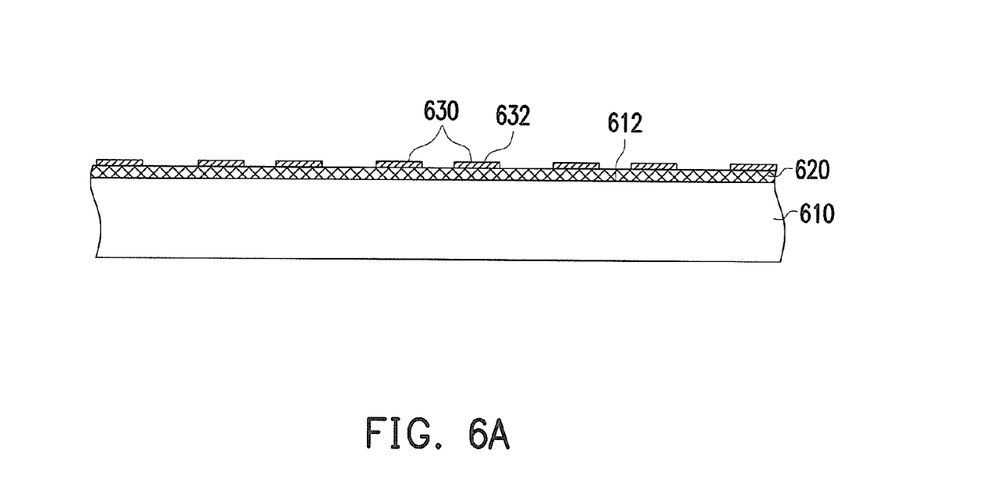
FIG. 6A through FIG. 6C sequentially illustrates a manufacturing process of an LED chip according to an embodiment of the present application.
Figure 6B:
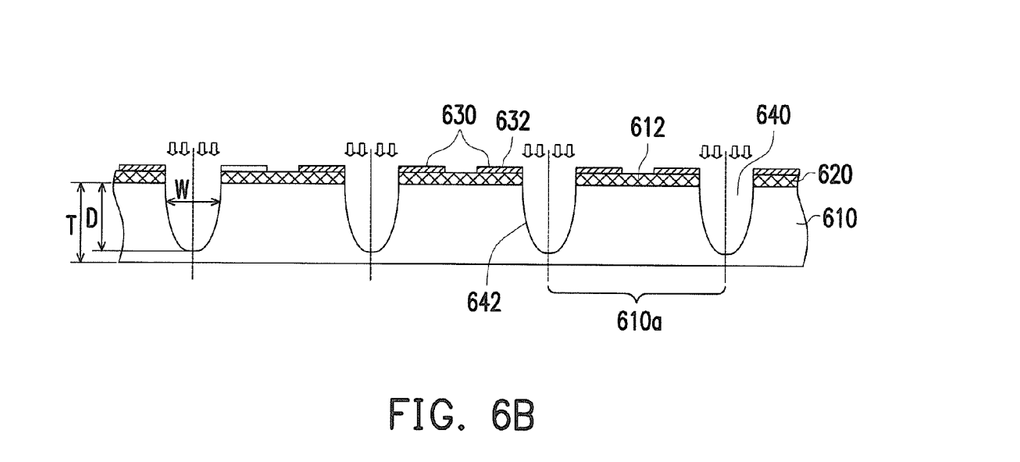
Figure 6C:
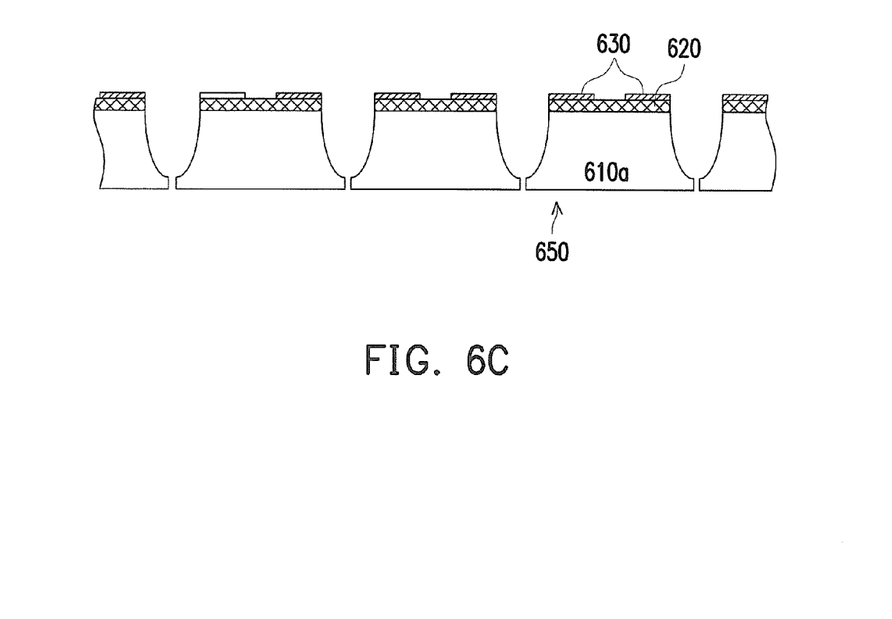

FIG. 6A through FIG. 6C sequentially illustrates a manufacturing process of an LED chip according to an embodiment of the present application.

Firstly, as shown in FIG. 6A, an LED structure layer 620 is formed on a top surface 612 of a growing substrate 610. Plural electrodes 630 are then formed on the LED structure layer 620, and the end surfaces 632 of the electrodes 630 may be substantially coplanar with one another. Herein, the growing substrate 610 may be a sapphire wafer or other applicable substrate. The LED structure layer 620 is essentially formed from gallium nitride based compound semiconductor, like GaN, AlGaN, InGaN or etc.

Next, as shown in FIG. 6B, plural trenches 640 are formed on the top surface 612 of the growing substrate 610, to define the growing substrate 610 into a plurality of substrate units 610a. In this step, a part of the LED structure layer 620 and a part of the growing substrate 610 may be removed by for example, dry etching, wet etching, laser cutting, mechanical cutting, etc. After that, the remaining LED structure layer 620 covers the top surface 612 rather than the trenches 640. In the present embodiment, each of the trenches 640 has a depth D in cross section view, and the width W gradually decreases along a direction away from the top surface 612 of the growing substrate 610. The depth D of each of the trenches 640 may be less than a thickness T of the growing substrate 610. For example, the depth D of each of the trenches 640 is 30~90% of the thickness T of the growing substrate 610.

Next, as shown in FIG. 6C, a dicing step is performed to separate the plurality of substrate units 610a from one another along the trenches 640, and then a plurality of LED chips 650 can be obtained. Each of the LED chips 650 comprises the substrate unit 610a, the LED structure layer 620 formed on the substrate unit 610a, and the electrodes 630 formed on the LED structure layer 620.

As to the above, the LED chips 650 can be fabricated by taking batch processing (wafer-level process) on the growing substrate 610 with the advantages of saving cost, improving yield, etc. Furthermore, the formed LED chip 650 can be the LED chip 110 having the slanted side surface 114c of the growing base 114 as shown in FIG. 1, or the LED chip 210 having the curved side surface 214c of the growing base 214 as shown in FIG. 3. In other words, profile of the side surface 114c (or 214c) of the growing base 114 (or 214) is determined by profile of the side surface 642 of the trench 640, which depends on the method of forming the trench 640. For example, a curved side surface 642 of the trench 640 can be formed by performing an isotropic etching, such as wet etching. Or, a slanted side surface (not shown) of the trench 640 can be formed by performing an anisotropic etching, such as dry etching.

It is noted that the side surface 642 of the trench 640 may be rough after the above wet etching step or dry etching step. In other words, uneven structures (such as the uneven structures 320 as shown in FIG. 1 or FIG. 3) may be formed on the side surface 642 of the trench 640 through the above etching step, wherein smaller sized uneven structures can be formed by the etching step, rather than additional laser cutting or mechanical cutting step.

Figure 7A:
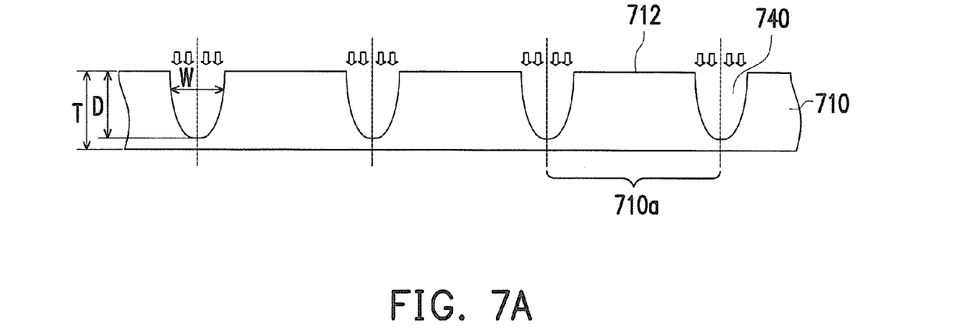
FIG. 7A through FIG. 7C sequentially illustrates a manufacturing process of an LED chip according to another embodiment of the present application.
Figure 7B:
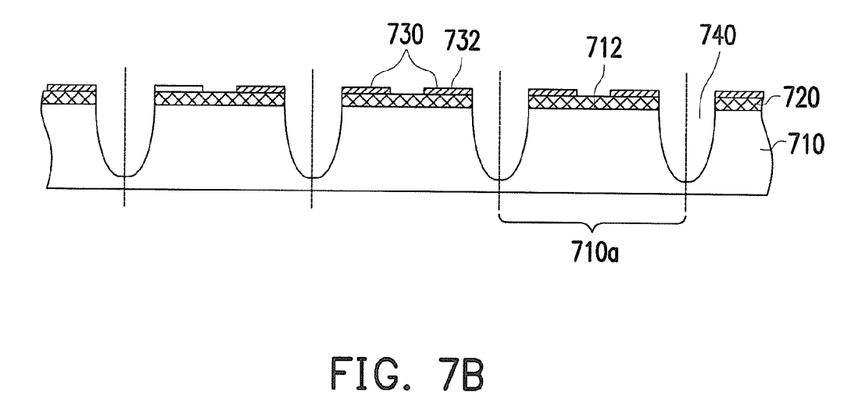
Figure 7C:
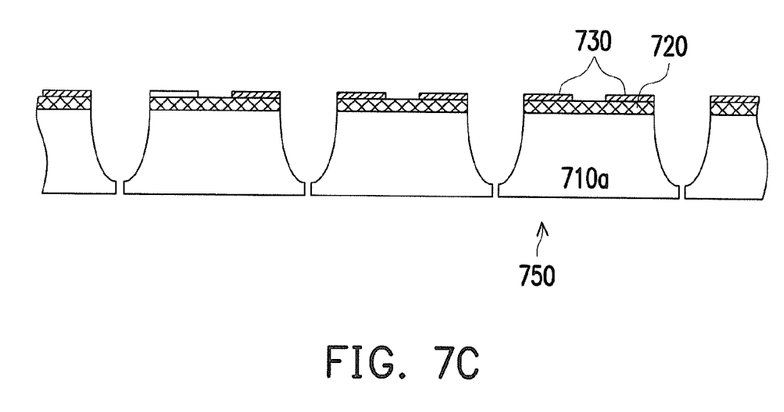

FIG. 7A through FIG. 7C sequentially illustrates a manufacturing process of an LED chip according to another embodiment of the present application. In this embodiment, trenches are formed before forming the LED structure layer.

Firstly, as shown in FIG. 7A, plural trenches 740 are formed on a top surface 712 of the growing substrate 710, to define the growing substrate 710 into a plurality of substrate units 710a. In this step, a part of the growing substrate 710 may be removed by for example, dry etching, wet etching, laser cutting, mechanical cutting, etc. Each of the trenches 740 has a depth D in cross section view, and the width W gradually decreases along a direction away from the top surface 712 of the growing substrate 710. The depth D of each of the trenches 740 may be less than a thickness T of the growing substrate 710. For example, the depth D of each of the trenches 740 is 30~90% of the thickness T of the growing substrate 710.

Next, referring to FIG. 7B, an LED structure layer 720 is formed on the top surface 712 of a growing substrate 710. The LED structure layer 720 covers the top surface 712 rather than the trenches 740. Plural electrodes 730 are then formed on the LED structure layer 720, and the end surfaces 732 of the electrodes 730 may be substantially coplanar with one another. Herein, the growing substrate 710 may be a sapphire wafer or other applicable substrate. The LED structure layer 720 is essentially formed from gallium nitride based compound semiconductor, like GaN, AlGaN, InGaN or etc.

Next, as shown in FIG. 7C, a dicing step is performed to separate the plurality of substrate units 710a from one another along the trenches 740, and then a plurality of LED chips 750 can be obtained. Each of the LED chips 750 comprises the substrate unit 710a, the LED structure layer 720 formed on the substrate unit 710a, and the electrodes 730 formed on the LED structure layer 720.

As to the above, the LED chips 750 similar to the aforementioned LED chips 650 can be obtained. Other features similar or identical to those mentioned above are not repeated hereinafter.

In summary, the LED chip of the present application has at least a portion of the side surface being curved or slanted. When the LED chip is packaged by forming an encapsulant thereon, the encapsulant can be tightly fixed to the growing base due to the specific geometry of the growing base, which effectively prevents delamination between the encapsulant and the growing base. Furthermore, the light emitting efficiency as well as uniformity of light output of the LED chip can be improved by forming the side surface of the growing base with at least a curved portion or slanted portion, and uneven structures can be formed on the curved portion or slanted portion to further improve the uniformity of light output. Furthermore, the light emitting diode chips can be fabricated by taking batch processing on the growing substrate, as provided in the wafer-level structure, with the advantages of saving cost, improving yield, etc.

It will be apparent to those skilled in the art that various modifications and variations can be made to the structure of the present application without departing from the scope or spirit of the application. In view of the foregoing, it is intended that the present application cover modifications and variations of this application provided they fall within the scope of the following claims and their equivalents.

What is claimed is:

1. A light emitting device, comprising:
   a light emitting diode (LED) chip, comprising:
     an LED structure layer, having a first surface and a second surface opposite to the first surface;
     two electrodes, disposed on the first surface;
     a growing base, comprising a third surface facing the LED structure layer, a fourth surface opposite to the third surface and a side surface connected between the third surface and the fourth surface; and
     a reflective layer, covering a portion of the first surface of the LED structure layer, and wherein the reflective layer is insulated from the two electrodes by gaps between the reflective layer and the two electrodes, wherein the area of the fourth surface is larger than the area of the third surface, and at least a portion of the side surface of the growing base is curved; and
   an encapsulant, covering the fourth surface of the growing base and exposing the two electrodes, wherein the encapsulant exposes the first surface of the LED structure layer, and the encapsulant has a fifth surface substantially coplanar with the first surface.

2. The light emitting device according to claim 1, wherein the growing base is translucent and disposed on the second surface of the LED structure layer.

3. The light emitting device according to claim 2, wherein a first portion of the side surface adjacent to the third surface is slanted, and a second portion of the side surface connected between the first portion and the fourth surface is flat and substantially perpendicular to the fourth surface.

4. The light emitting device according to claim 2, wherein the growing base further comprises uneven structures on the slanted portion of the side surface.

5. The light emitting device according to claim 1, wherein the reflective layer covers the fifth surface of the encapsulant.

6. The light emitting device according to claim 1, wherein the encapsulant comprises phosphors.

7. The light emitting device according to claim 1, wherein a first portion of the side surface adjacent to the third surface is curved, and a second portion of the side surface connected between the first portion and the fourth surface is flat and substantially perpendicular to the fourth surface.

8. The light emitting device according to claim 1, wherein the growing base further comprises uneven structures on the curved portion of the side surface.

9. The light emitting device according to claim 1, wherein the end surfaces of the two electrodes are substantially coplanar with each other.

* * * * *